United States Patent [19]

Fujii

[11] Patent Number: 4,578,772
[45] Date of Patent: Mar. 25, 1986

[54] VOLTAGE DIVIDING CIRCUIT

[75] Inventor: Shigeru Fujii, Yokohama, Japan

[73] Assignee: Fujitsu Limited, Kawasaki, Japan

[21] Appl. No.: 418,008

[22] Filed: Sep. 14, 1982

[30] Foreign Application Priority Data

Sep. 18, 1981 [JP] Japan .................................. 56-147292
Dec. 29, 1981 [JP] Japan .................................. 56-213402

[51] Int. Cl.$^4$ ............................................. H02M 3/06
[52] U.S. Cl. ................................... 364/850; 364/811; 363/62; 320/1
[58] Field of Search ................ 364/811, 850; 307/498, 307/264, 284; 328/141; 357/42, 48, 51, 86, 89; 338/48, 163, 164, 184, 199, 217; 323/281; 363/62, 204, 60; 320/1

[56] References Cited

U.S. PATENT DOCUMENTS

| | | | |
|---|---|---|---|
| 2,560,170 | 7/1951 | Gray | 328/161 |
| 3,305,676 | 2/1967 | Honore et al. | 364/850 |
| 3,488,597 | 1/1970 | Schlein | 364/811 |
| 3,492,471 | 1/1970 | Crowell | 307/498 |
| 3,550,022 | 9/1968 | Yareck | 328/161 |
| 3,816,803 | 6/1974 | Gordon | 320/1 |
| 3,818,207 | 6/1974 | Zschimmer | 364/850 |
| 3,903,434 | 9/1975 | Rauchenecker | 307/264 |
| 3,909,769 | 9/1975 | Rozena et al. | 338/48 |
| 3,919,699 | 11/1979 | Hidoshima | 320/1 |
| 4,137,464 | 1/1971 | Heller et al. | 320/1 |
| 4,137,492 | 1/1979 | Schultz | 320/1 |
| 4,205,369 | 5/1980 | Asano | 363/62 |
| 4,212,025 | 7/1980 | Hirasawa et al. | 357/51 |
| 4,245,209 | 1/1981 | Bertotti et al. | 338/217 |
| 4,433,282 | 2/1984 | Squires | 323/281 |
| 4,460,953 | 7/1984 | Fukushima | 363/62 |

Primary Examiner—Michael R. Fleming
Attorney, Agent, or Firm—Staas & Halsey

[57] ABSTRACT

The present invention relates to a voltage dividing circuit comprising capacitors or resistors. In the case of a voltage dividing circuit comprising capacitors, the capacitors are connected at one end to an output terminal and at the other end connected alternately to two power sources through changeover switches. The switches are selectively operated so that the capacitors divide the source voltages into fractions of the voltage. The average of the fractions of voltage is used an output voltage. The averaging of the fractions of voltage cancels out the characteristic difference among the capacitors. The fractions of voltage are changed by varying the time during which each capacitor is connected to either power source. Similarly, in the case of a voltage dividing circuit comprising resistors, the resistors divide a voltage into fractions. The average of the fractions of voltage is used as an output voltage. The voltage dividing circuit according to the present invention may employ the method used in the known voltage dividing circuits which comprise capacitors or resistors. In this case, the circuit can divide a voltage into smaller fractions of voltage than the known voltage dividing circuits. In other words, the circuit of the present invention can enhance the resolution of the analog output signal.

11 Claims, 16 Drawing Figures

VOLTAGE DIVIDING CIRCUIT

BACKGROUND OF THE INVENTION

1. Field of the Invention

The present invention relates to a voltage dividing circuit which utilizes charge redistribution by means of serially connected capacitors and a voltage dividing circuit which comprises serially connected resistors. More particularly, it relates to a voltage dividing circuit which minimizes the influence of the characteristic difference among the capacitors or resistors on the output voltage, i.e. a fraction of the total voltage. Further, the present invention relates to a voltage dividing circuit wherein each of the capacitors is connected alternately to power sources to obtain an average output voltage.

2. Description of the Prior Art

In recent years, the integration density of integrated circuits has been increasing. Along with the increase in integration density there is a trend in which various elements having different functions are formed on a single semiconductor chip. For example, a logic circuit system, which was once comprised of tens of semiconductor chips, is now made of only one semiconductor chip. This has successfully improved the cost-performance relationship of logic circuit systems. Now the requirement has arisen that a one-chip integrated circuit should process analog input data. Position data supplied to control devices, for example, are mainly analog data. So are most output data from sensors. In order to achieve a complicated sequence of control steps it is necessary to convert such analog data into digital data. It is therefore desired that analog-digital converters should be formed on a semiconductor chip using digital circuits.

Moreover, what is increasingly needed are digital-analog converters and analog-digital converters of high speed and high precision. This is because audio apparatus, PCM communication systems, video tape recorders and the like, which have conventionally processed analog data, are now being modified to process digital data. Therefore, it is preferred that a high-speed analog-digital or digital-analog conversion be performed. A digital circuit can easily enhance the accuracy of calculation merely by increasing the number of bits for each piece of digital data and can increase the operation speed. A digital circuit is required which will operate at a higher accuracy and with a higher speed than an analog circuit. This is being made possible by the technical researches and developments which are under way at present. In view of this trend it is strongly desired that the interface devices, i.e. digital-analog converters and analog-digital converters, and switched capacitor filters should be improved so that they may operate at a higher speed and may process data with a higher accuracy.

MOS integrated circuits which have a high integration density are used as large-scale logic integrated circuits in most cases. This is because they consume far less power than bipolar transistor integrated circuits and have a higher integration density. An MOS IC and an MOS LSI are advantageous in two respects. First, they can use MOS capacitors. Secondly, they can use voltage, current or charge as variables, while a bipolar transistor integrated circuit can use either resistance or current as variables.

Previously, in order to obtain analog data by a digital-analog conversion (DAC) or by internal DAC for analog-digital conversion (ADC), a current dividing circuit such as that shown in FIG. 1 was used in a bipolar transistor integrated circuit. The circuit of FIG. 1 comprises R-2R ladder resistors, thereby using a current branch circuit.

In the circuit of FIG. 1, the first and second resistors from the right, which have a resistance R, are connected in series. The sum of their resistances is thus 2R. The series circuit of these resistors is connected in parallel to the rightmost one of the other group of resistors whose resistance is 2R. The combined resistance 2R of the series circuit and the resistance 2R of the rightmost resistor is therefore R. The circuit having this sum resistance R is connected in series to the third resistor from the right, which has a resistance R, and the sum of the resistance is thus 2R. The circuit having this resistance 2R is connected in series to the second one of the resistors having a resistance 2R, counted from the right. The sum of resistance is therefore R. The remaining resistors, some having a resistance R and the other having a resistance 2R, are connected in the same way. Accordingly, the current flowing through the first and second resistors from the right which have a resistance R is i, the current flowing through the right most resistor having a resistance 2R is also i, the current flowing through the third resistor from the right which has a resistance 2R is 2i, the current flowing through the second resistor from the right which has a resistance 2R is also 2i, and so forth. The current distribution thus obtained is: i, 2i, 4i, 8, .... This is equivalent to current distribution of i, i/2, i/4, i/8, ... when the power source current is taken as reference. An output current of the circuit is taken through a transistor switch or the like by adding selected ones of the currents flowing through the respective resistors. This is how an analog signal, i.e. the output current, which corresponds to a digital input signal, is obtained. The circuit shown in FIG. 1 is used chiefly for a bipolar transistor integrated circuit. This is because a bipolar transistor, whose collector-emitter conductance is relatively large, may be used as a switching element since its conduction resistance is negligibly low as compared with the resistance of any resistors of the current dividing circuit such as shown in FIG. 1. By contrast, a MOS transistor has a output conductance smaller than that of a bipolar transistor. If its conduction resistance is to be made sufficiently low, it has to be too large to be suitable for an element of an integrated circuit and, therefore, it can not be applied to practical IC use.

For the reason mentioned above, a voltage dividing circuit such as that shown in FIG. 2 or FIG. 3 is used in an MOS transistor integrated circuit. The resistor circuit of FIG. 2 uses voltage as variable and the capacitor matrix circuit of FIG. 3 uses charge as variable.

The voltage dividing circuit shown in FIG. 2 comprises resistors $R_1$ to $R_n$ which have the same resistance and which are connected in series. The reference voltage $V_{REF}$ is divided into n equal fractions, and an output voltage (or potential) $V_{out}$ is taken from a selected one of the nodes $N_1, N_2, N_3, \ldots$ of the resistors $R_1$ to $R_n$. Current I is given by:

$$I = \frac{V_{REF}}{\sum_{i=1}^{n} R_i}$$

The output voltage $V_{out}$ from the j-th resistor is given by:

$$V_{out} = I \cdot \sum_{i=j}^{n} R_i$$

The value of analog voltage $V_{out}$ depends on the accuracy of each resistor used. The current I is indeed constant, but the maximum output voltage error $\Delta V_{out}$ will be:

$$\Delta V_{out} = I \cdot (n/2) \Delta R.$$

where $\Delta R$ is the difference in resistance among the resistors $R_1$ to $R_n$.

The capacitor matrix circuit of FIG. 3 comprises capacitors $C_0$, $C_0$, $2C_0$, $4C_0$ and $8C_0$, switches $S_1$ to $S_5$ and two power sources $V_1$ and $V_2$ where $V_1$ has a higher potential than $V_2$. Each of the switches $S_1$ to $S_5$ have one movable contact and two stationary contacts. When the switches $S_1$ to $S_4$ have their movable contacts connected to their left stationary contacts and the switch $S_5$ has its movable contact connected to its right stationary contact, there will be formed a circuit of the parallel capacitors $C_0$, $C_0$, $2C_0$ and $4C_0$ in series with the capacitor $8C_0$. The total capacitance of the circuit is $16C_0$. The output voltage $V_{out}$ is therefore $(V_1-V_2)/2$, i.e. the voltage exactly halfway between $V_1$ and $V_2$. This output voltage is expressed in potential as: $(V_1-V_2)/2+V_2=(V_1+V_2)/2$. Suppose the movable contact of the switch $S_4$ is connected to the right stationary contact. Then, there will be formed a circuit of the parallel capacitors $C_0$, $C_0$ and $2C_0$ in series with the parallel capacitors $4C_0$ and $8C_0$. The output voltage $V_{out}$ will then be $(V_1+3V_2)/4$ which is higher than $V_2$ by $(V_1-V_2)/4$. Similarly, various output voltages $V_{out}$ which are 15/16, 14/16, 13/16, ... of $(V_1-V_2)$ will be obtained by connecting the movable contacts of the switches $S_1$ to $S_5$ to the right or left stationary contacts. (Various potentials each of which is the sum of the output voltage $V_{out}$ and voltage $V_2$ will be obtained).

For the voltage dividing circuit of FIG. 3, it is required that every capacitor should have a correct capacitance ratio to any other capacitor. The output voltage $V_{out}$ would otherwise be erroneous. This will be described with reference to FIG. 4.

As evident from the principle of charge redistribution, the output voltage $V_{out}$ of the circuit shown in FIG. 4 is given by:

$$V_{out} = V_2 + \frac{C_{01}}{C_T} (V_1 - V_2) + \frac{Q_0}{C_T}$$

where $V_1$ and $V_2$ are voltages applied to two input terminals and $C_T$ is the sum of $C_{01}$, $C_{02}$ and the initial charge $Q_0$. If the capacitance of the capacitor $C_{01}$ differs by $\Delta C_0$ from the capacitance of the capacitor $C_{02}$ and the initial charge $Q_0$ is neglected, the output voltage $V_{out}$ will then be:

$$V_{out} = V_2 + \frac{C_{01} + \Delta C_0}{C_{01} + C_{02}} (V_1 - V_2).$$

The output error $\Delta V_{out}$ will be:

$$\Delta V_{out} = \frac{\Delta C_0}{C_{01} + C_{02}} (V_1 - V_2).$$

The initial charge $Q_0$ is almost held constant, because this charge is periodically compensated via an external switch (not shown) which is connected to the output terminal $V_{out}$ and a reference voltage.

In a capacitor matrix circuit having more capacitor (e.g. N capacitors), $C_T$ and $\Delta V_{out}$ are given by:

$$C_T = \sum_{n=1}^{N} C_{0n},$$

$$\Delta V_{out} = (V_1 - V_2) \cdot \frac{N}{2} \cdot \frac{\Delta C_0}{C_T}$$

Obviously, both $C_T$ and $V_{out}$ are similar to those in a series circuit of resistors. Hence, in order to make the output voltage $V_{out}$ as accurate as possible, it would be necessary to have accurate capacitances for the respective capacitors. In view of the manufacturing techniques available at present, however, a $\Delta C_0/C_0$ of 1% persistently exists as an error.

The above described conventional voltage, current or charge dividing circuits have such a drawback in that the divisional error increases with an increase in the number of data bits in a digital signal due to the fact that the accuracy of a division of voltage, current or charge depends on the accuracy with which each resistor or capacitor was manufactured. In the circuit of FIG. 2, for example, a total current I is constant as expressed by the equation of $$I = V_{REF} / \sum_{n=0}^{N} R_n,$$

but each node voltage $V_m$ is expressed by the equation of $$V_m = I \cdot \sum_{n=0}^{m} R_n = I \left( mR + \sum_{n=0}^{m} \Delta R_n \right),$$

thereby producing an error in the output voltage $V_m$ that is the sum of the errors $\Delta R$ of the resistances of the respective resistors.

The known current dividing circuits and voltage dividing circuits described above need to have more and more elements if they are to improve the accuracy of the output signal. The R-2R ladder circuit of FIG. 1, for example, needs an additional pair of resistors having resistances R and 2R, respectively, in order to process an input digital signal having an additional bit. The voltage dividing circuit of FIG. 2 for an MOS transistor integrated circuit, for which an R-2R ladder circuit is useless, needs $2^N$ resistors in order to process an input N-bit digital signal. The voltage dividing circuit shown in FIG. 3 needs $2^N$ capacitors in order that the capacitors connected in parallel provide an output voltage corresponding to any input N-bit digital signal. In short, the known circuits must have a great number of resistors or capacitors in order to improve the resolution with which to process input digital signals. These resistors or capacitors are large and need to be made with high precision unlike those used in a digital logic circuit.

In consequence, the known circuit is unavoidably large and difficult to manufacture.

SUMMARY OF THE INVENTION

An object of the present invention is to solve the above-mentioned problems inherent in the known current dividing circuits and the known voltage dividing circuits.

Another object of the present invention is to provide a voltage dividing circuit comprising capacitance elements which are connected alternately to two power sources. An average of the output voltage with respect to time is obtained which cancels out the difference in capacitance of respective capacitors. The result is that the difference in capacitance of the respective capacitors does not affect a divisional voltage obtained from the dividing circuit.

Another object of the present invention is to provide a voltage dividing circuit whose elements are connected to receive one of the reference voltages or the like which is selected by a control signal having a duty cycle corresponding to an input digital signal supplied to a digital-analog converter. Thereby the characteristic difference among the elements does not affect the output voltage. In the present invention the resolution with which the input digital signal is processed is enhanced without increasing the number of necessary elements and thus without increasing the area occupied by the necessary elements, while providing a digital-analog converter having high accuracy.

The voltage dividing circuit according to the invention comprises a plurality of capacitors which are connected at one end are to an output terminal and at the other end connected alternately to a first power source and a second power source. An output voltage generated by dividing a voltage into fractions using the capacitors is taken out at the output terminal as a function of the average of the periods during which each capacitor is connected to the first and second power sources, respectively.

DESCRIPTION OF THE PREFERRED EMBODIMENT

Figure 5:
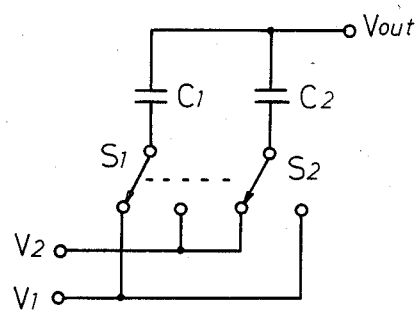
FIG. 5 is a circuit diagram of one embodiment of the present invention.
Figure 6:
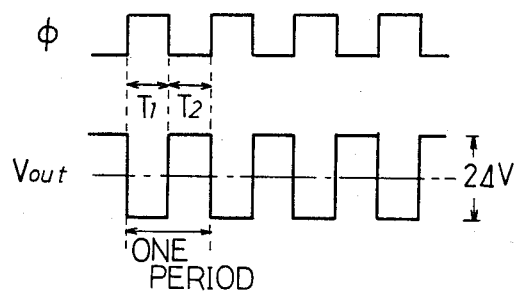
FIG. 6 illustrates a waveform of a clock signal used in the embodiments of FIG. 5 and a waveform of an output signal from the embodiment of FIG. 5.

A few embodiments of the invention will be described in detail with reference to the accompanying drawings. FIG. 5 shows the most fundamental embodiment of the present invention, which comprises two capacitors $C_1$ and $C_2$. The capacitor $C_1$ is connected at one end to the movable contact of a switch $S_1$ and at the other end to an output terminal $V_{out}$. The capacitor $C_2$ is connected at one end to the movable contact of a switch $S_2$ and at the other end to the output terminal $V_{out}$. Either switch has a first stationary contact connected to a first power source $V_1$ and a second stationary contact connected to a second power source $V_2$. Both switches $S_1$ and $S_2$ are electronic switches such as MOS transistors. The capacitors $C_1$ and $C_2$ have the same capacitance. The movable contacts of both switches $S_1$ and $S_2$ are connected alternately to the first stationary contacts and the second stationary contacts in synchronism with a clock signal $\phi$ shown in FIG. 6. If the capacitors $C_1$ and $C_2$ are connected to the first power source $V_1$ and the second power source $V_2$, respectively, as illustrated in FIG. 5 for period $T_1$ during which the clock signal $\phi$ has a level "1", the output voltage $V_{out}$ will then have the following value:

$$V_{out1} = V_2 + \frac{C_1}{C_1 + C_2} (V_1 - V_2) \tag{1}$$

Conversely, if the movable contacts of the switches $S_1$ and $S_2$ are connected to the second power source $V_2$ and the first power source $V_1$, respectively, for period $T_2$ during which the clock signal $\phi$ has a level "0", the output voltage $V_{out}$ will then have the following value:

$$V_{out2} = V_2 + \frac{C_2}{C_1 + C_2} (V_1 - V_2) \tag{2}$$

As described above, the capacitors $C_1$ and $C_2$ have the same capacitance. Output voltages $V_{out1}$ and $V_{out2}$ thus have the same value. In practice, however, the capacitors cannot be identical and some difference exists between them. Assume that there is a difference $\Delta C_0$ between the capacitances of the capacitors $C_1$ and $C_2$. There will then be a difference $\Delta V$ between the output voltages $V_{out1}$ and $V_{out2}$. The difference $\Delta V$ is given by:

$$\Delta V = \frac{\Delta C_0}{C_1 + C_2} (V_1 - V_2),$$

Where $C_1 = C_0 \Delta C_0$ and $C_2 = C_0 - \Delta C_0$. The output voltages $V_{out1}$ and $V_{out2}$ are of the opposite polarities. Hence, the output voltage $V_{out}$ and will contain a ripple, or a potential 2 V which is twice the difference $\Delta V$, when the switches $S_1$ and $S_2$ are changed in synchronism with the clock signal $\phi$ shown in FIG. 6. The ripple can be removed from the output voltage $V_{out}$ by means of a low-pass filter. Nonetheless, the output voltage can be averaged even if no low-pass filter is used. This is because an operational amplifier which is usually included in the last stage of the capacitor circuit has an integrator. The output voltage $V_{out}$ thus averaged, or voltage $V_{out}$, is indicated by a one-dot-one-dash line in FIG. 6. The voltage $V_{out}$ is expressed as follows:

$$V_{out} = (V_{out1} + V_{out2})/2$$

$$= V_2 + \frac{C_1 + C_2}{C_1 + C_2} (V_1 - V_2)/2$$

$$= V_2 + \frac{1}{2}(V_1 - V_2)$$

$$= \frac{1}{2}(V_1 + V_2).$$

Obviously, the voltage dividing circuit shown in FIG. 5 can provide an output voltage which is not affected by the capacitance difference $\Delta C$ between the capacitors $C_1$ and $C_2$. However, the difference C cannot be completely cancelled out if period $T_1$ and period $T_2$ are not extactly the same. If a difference T exists between periods $T_1$ and $T_2$, the average output voltage $V_{out}$ is given by:

$$V_{out} = \frac{T_1}{T_1 + T_2} V_{out1} + \frac{T_2}{T_1 + T_2} V_{out2}$$

If $\Delta T = |T_1 - T_2|$, then the ratio of error $\Delta V$ to the desired output voltage V will be given by:

$$\frac{\Delta V}{V} = \frac{\Delta C_0}{C_0} \cdot \frac{\Delta T}{T},$$

where V is the theoretical value of $V_{out}$ and T is the theoretical value of $T_1$ and $T_2$. In spite of this, it is easier with the circuit of FIG. 5 than with the conventional similar circuit to reduce $\Delta T/T$ to about 0.1%. The output voltage of the circuit of FIG. 5 is therefore far more close to the desired value than that of the conventional circuit. The clock signal $\phi$ may be obtained by dividing a 1 MHz clock signal commonly used in microcomputers with a proper frequency dividing ratio. $\Delta T/T$ may then be more reduced. For example, if the clock signal $\phi$ is obtained by dividing a 10 MHz clock signal with a 1.0% phase shift into a 10 KHz clock signal and then by correcting the 10 KHz clock signal through a 10 MHz synchronization, the clock signal $\phi$ will have a very small error of 0.01%. Hence, the output voltage of the circuit shown in FIG. 5, i.e. an analog output signal, will have an extremely small error of 0.0001% even if $\Delta C_0/C_0$ is 1%.

Moreover, it is possible with the voltage dividing circuit of FIG. 5 to achieve the second object of the present invention. That is, the error of the output voltage, which results from the capacitance difference $\Delta C$, can be corrected by changing the duty cycle of the clock signal $\phi$.

Figure 7:
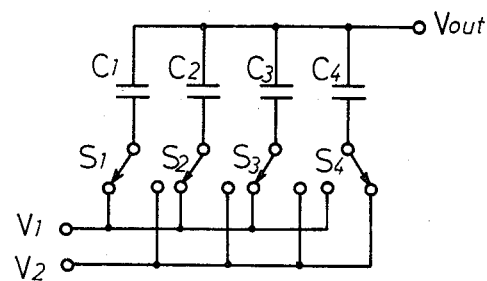
FIG. 7 is a circuit diagram of another embodiment of the present invention.

FIG. 7 shows another embodiment of the present invention, which has four capacitors $C_1$ to $C_4$ of substantially the same capacitance. These capacitors $C_1$ to $C_4$ are connected at one end to an output terminal $V_{out}$. The other ends of the capacitors $C_1$ to $C_4$ may be connected alternately to a first power source $V_1$ and a second power source $V_2$ through switches $S_1$ to $S_4$, respectively. Unlike the switches used in the embodiment of FIG. 5, the switches $S_1$ to $S_4$ are not interlockingly operated. Any two of the four capacitors $C_1$ to $C_4$ may be combined to form a first parallel capacitor circuit, and the remaining two capacitors may be combined to form a second parallel capacitor circuit. This can be accomplished by selectively changing the switches $S_1$ to $S_4$. As a result, the theoretical value of the output voltage $V_{out}$ will be $(V_1+V_2)/2$. Alternatively, any three of the four capacitors $C_1$ to $C_4$ may be combined to form a parallel capacitor circuit and the remaining one capacitor may be used alone. This can also be accomplished by selectively changing the switches $S_1$ to $S_4$. As a result, the theoretical value of the output voltage $V_{out}$ will be $3(V_1+V_2)/4$ in this case.

In order to cancel out a variation of the output voltage $V_{out}$, which results from the difference in capacitance among the capacitors $C_1$ to $C_4$, voltages $V_1$ and $V_2$ are alternately applied to the series capacitor circuit. The application of voltages $V_1$ and $V_2$ is performed in a stepwise fashion if the theoretical value of the output voltage $V_{out}$ is other than $(V_1-V_2)/2$.

Figure 8:
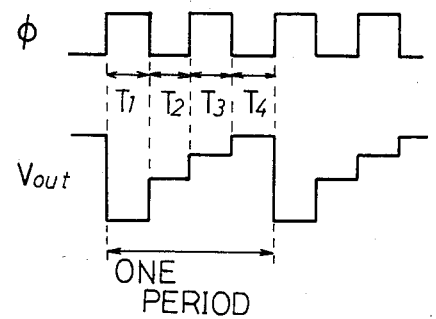
FIG. 8 is illustrates a waveform of a clock signal used in the embodiment of FIG. 7 and a waveform of an output signal from the embodiment of FIG. 7.

Now with reference to FIG. 8 it will be described how the circuit of FIG. 7 operates when any three of the capacitors $C_1$ to $C_4$ are combined to form a parallel capacitor circuit and the remaining one capacitor is used alone.

During any period of a clock pulse $\phi$ (FIG. 8), period $T_1$, $T_2$, $T_3$ or $T_4$, one of the switches $S_1$ to $S_4$ is changed. Suppose the switches $S_1$ to $S_4$ are at first put in a state such as that illustrated in FIG. 7, the capacitors $C_1$ to $C_3$ being connected in parallel and connecting the capacitors $C_1$ to $C_3$ to the first power source $V_1$ and the switch $S_4$ connecting the capacitor $C_4$ to the second power source $V_2$. Then, the switch $S_3$ is changed, thus connecting the capacitor $C_3$ to the second power source $V_2$ and the switch $S_4$ is changed, thus connecting the capacitor $C_4$ to the first power source $V_1$. Next, the switch $S_2$ is changed, thus connecting the capacitor $C_2$ to the second power source $V_2$ and the switch $S_3$ is changed over, thus connecting the capacitor $C_3$ to the first power source $V_1$. Further, the switches $S_1$ and $S_2$ are changed in similar manner, and then switches $S_4$ and $S_1$ are changed in like manner, and so forth. As the switches $S_1$ to $S_4$ are so operated, a ripple such as that shown in FIG. 8 appears in the output voltage $V_{out}$ over a one-cycle period of the circuit (i.e. periods $T_1$ to $T_4$ put together). (The ripple is not necessarily stepwise as illustrated in FIG. 8). The ripple is inevitably generated because there is a capacitance difference among the capacitors $C_1$ to $C_4$. The average value of the varying output voltage $V_{out}$ is used as the ultimate analog output signal, in just the same way as in the embodiment of FIG. 5.

The capacitors $C_1$ to $C_4$ may be each a MOS capacitor, such as a gate capacitor using a gate oxide film as an insulating film or a capacitor using an inter-layer insulating film. The switches $S_1$ to $S_4$ may be, like the switches used in the embodiment of FIG. 5, electronic switches using MOS transistors. As will be evident from the above, the capacitors $C_1$ to $C_4$ need not have the same capacitance. (If they have different capacitances, the result is no more than an increased ripple in the output voltage $V_{out}$.)

Figure 9:
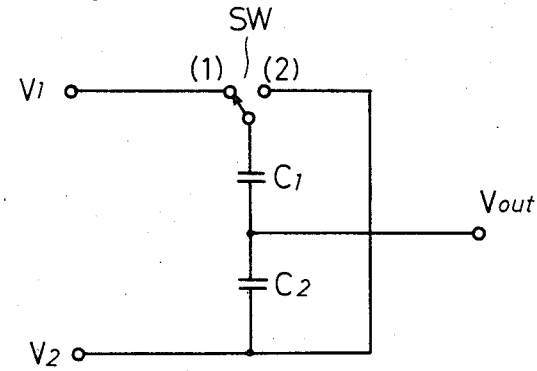
FIG. 9 is a circuit diagram illustrating the operation of a digital-analog converter to which the present invention is applied.
Figure 10:
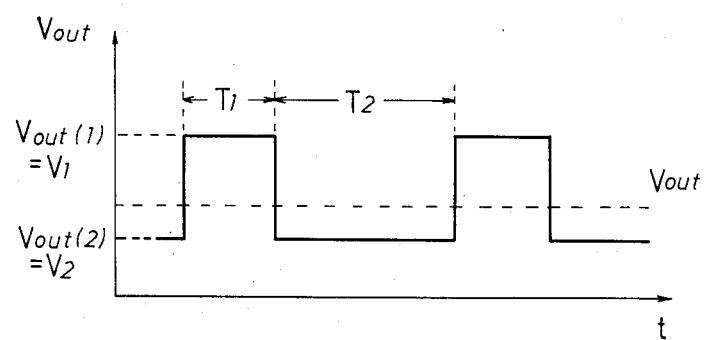
FIG. 10 illustrates a waveform of an output signal from the digital-analog converter shown in FIG. 9.

FIG. 9 shows a voltage dividing circuit for a digital-analog converter which in another embodiment of the present invention. The voltage dividing circuit comprises two capacitors $C_1$ and $C_2$ comprising a voltage divider and a switch SW which is changed with a duty cycle corresponding to a digital input signal. The capacitor $C_1$ is connected at one end to an output terminal $V_{out}$ and at the other end to the movable contact of the switch SW. The capacitor $C_2$ is connected at one end to the output terminal $V_{out}$ and at the other end to a second power source $V_2$. The first stationary contact (1) of the switch SW is connected to a first power source $V_1$, and the second stationary contact (2) of the switch SW is connected to the second power source $V_2$.

According to the law of charge distribution, the output voltage $V_{out(1)}$ generated when the movable contact of the switch SW is connected to the first stationary contact (1) and the output voltage $V_{out(2)}$ generated when the movable contact is connected to the second stationary contact (2) are given by:

$$V_{out(1)} = V_2 + \frac{C_1}{C_1 + C_2}(V_1 - V_2) \tag{3}$$

$$V_{out(2)} = V_2. \tag{4}$$

If the voltage $V_{out(1)}$ and $V_{out(2)}$ are averaged by removing a ripple from them by means of a low-pass filter, the average output voltage $V_{OUT}$ will then be given as follows:

$$V_{OUT} = \frac{T_1}{T_1 + T_2} V_{out(1)} + \frac{T_2}{T_1 + T_2} V_{out(2)} \tag{5}$$

$$= V_2 + \frac{T_1}{T_1 + T_2} \cdot \frac{C_1}{C_1 + C_2}(V_1 - V_2)$$

where $T_1$ is the time during which the movable contact is connected to the first stationary first contact (1) and $T_2$ is the time during which the movable contact is connected to the second stationary contact (2). That is, the voltage is divided by the ratio of the capacitance of the capacitor $C_1$ to that of the capacitor $C_2$ and further by the ratio of $T_1$ to $T_2$. If $C_1 = C_2$ and $T_1 = T_2$, the average output voltage $V_{OUT}$ will be given as follows:

$$V_{OUT} = V_2 + \tfrac{1}{4}(V_1 - V_2) \tag{6}$$

If $C_1 = 2C_2$ and $T_1 = 2T_2$, then:

$$V_{OUT} = V_2 + (4/9)(V_1 - V_2) \tag{7}$$

In the circuit of FIG. 9, both capacitors $C_1$ and $C_2$ are gradually discharged with time. It is therefore necessary to charge them at proper intervals. The intervals can be much longer than time $(T_1 + T_2)$ and will not affect the voltgage division which is achieved by changing over the switch SW. The clock signals which controls the switch SW and which has a duty cycle of $T_1/(T_1+T_2)$ may be obtained by, for example, frequency-dividing a master clock signal commonly used in microcomputers or various digital circuits into signals of various frequencies and by supplying these signals to a logic circuit comprising flip-flops, logic gates and the like. The control clock signal thus obtained may have a desired pulse width. More specifically, if the master clock signal has a cycle of $T_0$, the minimum error of time $T_1$ and time $T_2$ is $T_0$. Assume $T_1 + T_2 = 2^{10}$. Then, $2^{10} + 1$ kinds of control clock signals having different pulse widths can be obtained. In other words, the circuit of FIG. 9 can provide an output voltage of 10-bit resolution. If a master clock signal of 10 MHz is used, $T_0$ will be 100 ns. In order to provide an output voltage of a 10-bit resolution, $T_1 + T_2 = 2^{10}$. 100 ns. Since $2^{10} = 1024$, $T_1 + T_2$ is approximately 102 μs. Apparently, an output voltage of a 10-bit resolution can be generated if a sampling frequency of 9.8 KHz is used. That is, the output voltage can be varied every 102 μs.

Further, the ripple can be removed from the output voltage of the circuit shown in FIG. 9 by a low-pass filter whose cutoff frequency falls in the audio frequency range, i.e. 3.4 KHz to 4 KHz. In other words, a low-pass filter whose cutoff frequency ranges from 3.4 KHz to 4 KHz may be used to smooth the output voltage from the voltage dividing circuit of FIG. 9.

Figure 4:
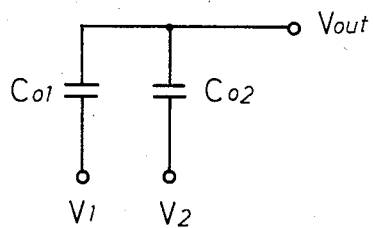

The circuit of FIG. 9 having two capacitors and one switch, a smoothing filter comprised of operational amplifiers, resistors and capacitors, and a control pulse generator can comprise a digital-analog converter. Obviously, the circuit of FIG. 9 helps to reduce the necessary elements of such a digital-analog converter and thus helps to enhance the IC packing density of the digital-analog converter. This basic idea can be utilized also in the embodiments of FIGS. 4 and 6. In the circuit of FIG. 9, as in the embodiments of FIGS. 4 and 6, a voltage error due to a difference in capacitance between the capacitors $C_1$ and $C_2$ can be corrected.

Figure 11:
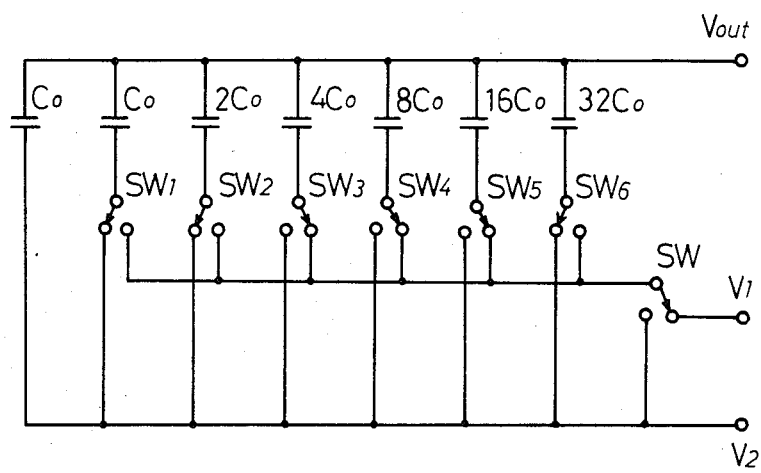
FIGS. 11 and 12 are circuit diagrams of other voltage dividing circuits according to the present invention.

FIG. 11 is another embodiment of a voltage dividing circuit according to the invention. This embodiment can divide a voltage not only by a time ratio but also by a capacitance ratio in accordance with a digital input signal and can enhance the resolution and accuracy of the output voltage without lowering the sampling frequency used. The circuit of FIG. 11 comprises capacitors $C_0$, $2C_0$, $4C_0$, $8C_0$, $16C_0$ and $32C_0$ whose capacitances are weighted by square of 2, switches $SW_1$, $SW_2$, $SW_3$, $SW_4$, $SW_5$ and $SW_6$ which are used to vary the capacitance ratio, or the voltage division ratio, and a switch SW which is used to achieve voltage division according to the time ratio, i.e. pulse width modulation. The capacitors $C_0$, $2C_0$, $4C_0$, $8C_0$, $16C_0$ and $32C_0$ are connected at one end to an output terminal $V_{out}$ and at the other end to the movable contacts of the switches $SW_1$ to $SW_6$, respectively. Each of the switches $SW_1$ to $SW_6$ has a first stationary contact connected to a second power source $V_2$ and a second stationary contact connected to the movable contact of the switch SW. The switch SW has a first stationary contact connected to a first power source $V_1$ and a second stationary contact connected to the second power source $V_2$. Another capacitor $C_0$ is connected at one end to the output terminal $V_{out}$ and at the other end to the second power source $V_2$.

In the circuit of FIG. 11, six bits constituting comprising a digital input signal are used to change the switches $SW_1$ to $SW_6$, and the capacitors $C_0$, $2C_0$, $4C_0$, $8C_0$, $16C_0$ and $32C_0$ are used to divide the reference voltages $V_1$ and $V_2$ to provide various output voltages. When the switch SW is connected to the first power source $V_1$ as shown in FIG. 11, the output voltage $V_{OUT}$ of the circuit is given by:

$$V_{OUT} = V_2 + \frac{nC_0}{C_T}(V_1 - V_2), \tag{8}$$

where $C_T = 2^6 C_0$ and n is 0–63.

If the switch SW is alternately connected to the power source $V_1$ and the power source $V_2$ under the control of pulse width modulation, the output voltage $V_{OUT}$ is then given by the following equation:

$$V_{OUT} = V_2 + \frac{T_1}{T_1 + T_2} \cdot \frac{nC_0}{C_T} (V_1 - V_2), \qquad (9)$$

where $T_1$ is the time during which the switch SW is connected to the first power source $V_1$ and $T_2$ is the time during which the switch SW is connected to the second power source $V_2$.

Hence, the circuit can provide an output voltage having a 10-bit resolution by changing the pulse width of the control clock signal, using, for example, the four bits of a digital input signal. If a 10 MHz clock signal is used as a master clock signal from which the control clock signal is obtained, $T_1 + T_2$ will be 1.6 μs and the sampling frequency will be 625 KHz. The accuracy of the output voltage $V_{OUT}$ is determined by two factors, the accuracy of the capacitance of each capacitance used and the accuracy of time $T_1$ and time $T_2$. The control clock signal for connecting the switch SW to the first power source $V_1$ for time $T_1$ and to the second power source $V_2$ for time $T_2$ is generated by processing a master clock signal which has been generated by a quartz crystal oscillator. The accuracy of time $T_1$ and the accuracy of time $T_2$ can thus be extremely high. Accordingly, even if the accuracy of each capacitor is low, the circuit of FIG. 11 can provide a sufficiently accurate output voltage $V_{OUT}$ by selectively changing the switches $SW_1$ to $SW_6$ under the control of the lower bits of the digital input signal and by performing pulse width modulation under the control of the higher bits of the digital input signal. If the higher bits of the digital input signal are used to change the switches $SW_1$ to $SW_6$ and the lower bits of the digital input signal are used to achieve the pulse with modulation, the frequency of the ripple in the output voltage $V_{OUT}$ will be raised. In this case, the ripple can be removed to a satisfactory degree by a wide-band, low-pass filter.

Figure 12:
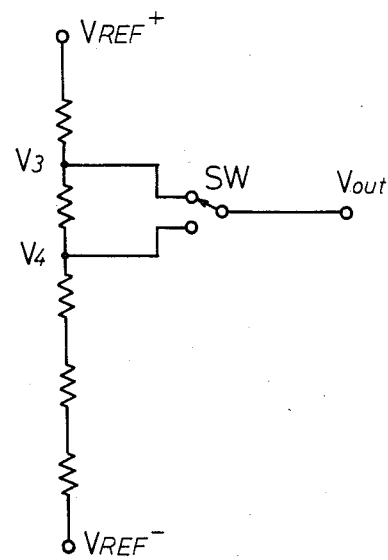

FIG. 12 shows still another embodiment of the present invention, a voltage dividing circuit which comprises resistors connected in series and which utilizes pulse width modulation. More precisely, a series circuit of resistors is connected between a reference voltage $V_{REF}^-$ and a reference voltage $V_{REF}^+$. The resistors divide the voltage ($V_{REF}^+ - V_{REF}^-$), thus generating voltage $V_3$ and voltage $V_4$. These voltages $V_3$ and $V_4$ are alternately supplied as a switch SW is changed over repeatedly according to a digital input signal. Let $T_3$ denote the time during which the switch SW supplies voltage $V_3$ and $T_4$ denotes the time during which the switch SW supplies voltage $V_4$. Then, the average output voltage $V_{OUT}$ of the circuit is expressed as follows:

$$V_{OUT} = V_4 + \frac{T_3}{T_3 + T_4} (V_3 - V_4). \qquad (10)$$

Obviously, the output voltage $V_{OUT}$ correctly represents the digital input signal. Other voltages than voltages $V_3$ and $V_4$ can be supplied through the switch SW merely by connecting the taps connected to the stationary contacts of the switch SW to the nodes of the other resistors. If necessary, voltage $V_{REF}^-$ and voltage $V_{REF}^+$ may alternately be supplied through the switch SW. If this is the case, the output voltage $V_{OUT}$ ranges from $V_{REF}^-$ to $V_{REF}^+$. Further, the duty cycle of a clock signal controlling the switch SW may be varied, thus varying time $T_3$ and time $T_4$. Then, the resolution of the output voltage $V_{OUT}$ may be enhanced.

Figure 13:
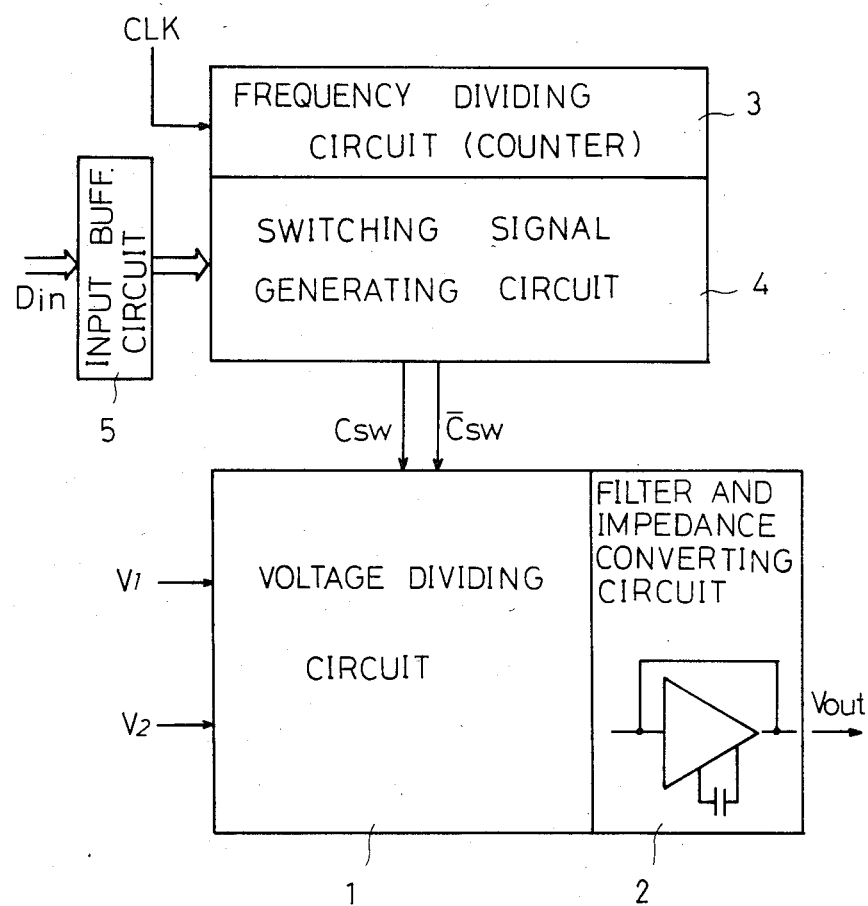
FIG. 13 is a block diagram of a digital-analog converter in which an embodiment of the invention is used.

FIG. 13 is a block diagram of a digital-analog converter which uses a voltage dividing circuit according to the invention. The digital-analog converter comprises a voltage dividing circuit 1 such as the circuit of FIG. 9, the circuit of FIG. 11 or the circuit of FIG. 12. It further comprises a filter/impedance converting circuit 2, a frequency dividing circuit 3, a switching signal generating circuit 4 and an input buffer circuit 5. The filter/impedance converting circuit 2 includes an operational amplifier, a resistor and a capacitor, and functions as both a smoothing low-pass filter, in other word an averaging circuit and an output buffer circuit. The frequency dividing circuit 3 is comprises a digital counter or the like.

The frequency dividing circuit 3 divides the frequency of a master clock signal CLK, thus generating pulse signals of various frequencies and acting as a pulse generating circuit. The pulse signals are supplied to the switching signal generating circuit 4. A digital input signal $D_{IN}$ is also supplied to the switching signal generating circuit 4 through the input buffer circuit 5. The switching signal generating circuit 4 generates switching signals $C_{SW}$ and $\overline{C}_{SW}$ which have a duty cycle corresponding to the digital input signal $D_{IN}$. These signals $C_{SW}$ and $\overline{C}_{SW}$ are supplied to the voltage dividing circuit 1. The frequency dividing circuit 1 divides voltage $V_1$ and voltage $V_2$ in accordance with the switching signals $C_{SW}$ and $\overline{C}_{SW}$. The output voltage from the voltage dividing circuit 1 is smoothed by the filter/impedance converting circuit 2, thus generating an analog output signal, i.e. an output voltage $V_{OUT}$, which corresponds to the digital input signal $D_{IN}$. If the voltage dividing circuit 1 is the circuit shown in FIG. 11, a portion of the digital input signal $D_{IN}$ is supplied to the voltage dividing circuit 1 through the input buffer circuit 5.

Figure 14:
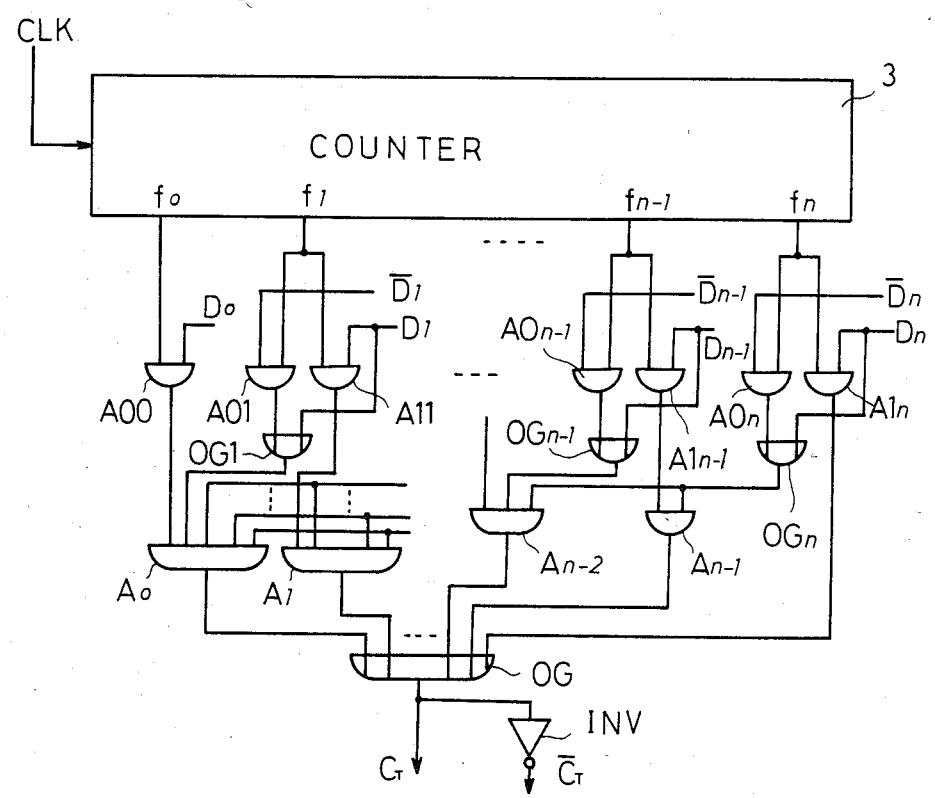
FIG. 14 is a circuit diagram of a switching signal generating circuit used in the digital-analog converter shown in FIG. 13.
Figure 15:
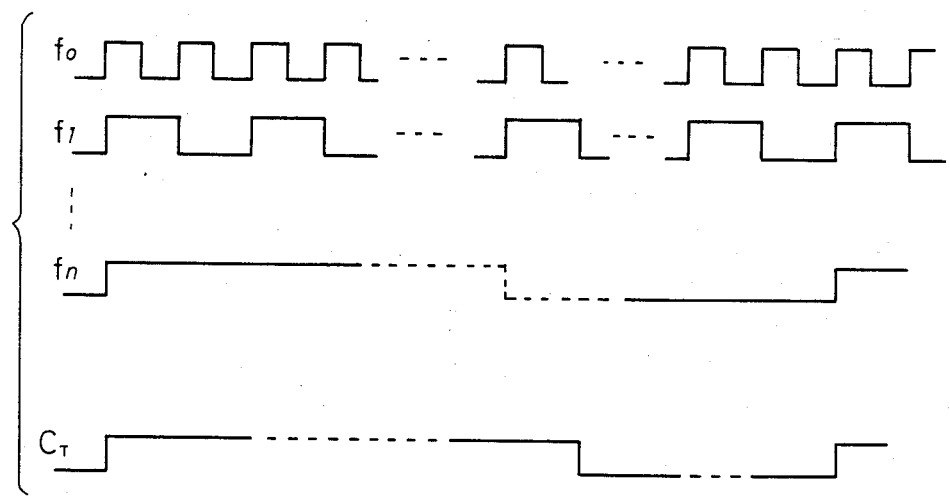
FIG. 15 is a timing chart illustrating the operation of the circuit shown in FIG. 14.

The switching signal generating circuit 4 has a structure such as that illustrated in FIG. 14. As shown in FIG. 14, the circuit 4 comprises AND gates A00, A01, A11, ..., A0$_{n-1}$, A1$_{n-1}$, A0$_n$, A1$_n$; AND gates A0, A1, ..., A$_{n-2}$ and A$_{n-1}$; OR gates OG1, ..., OG$_{n-1}$, OG$_n$ and OG; and an inverter INV. The frequency dividing circuit or counter 3, counts input clock signals CLK and generates pulse signals of different frequencies $f_0, f_1, ..., f_n$ which are shown in FIG. 15. The OR gates OG1, ..., OG$_n$ and OG and the AND gates A0, A1, ..., A$_{n-1}$ comprise a waveform generating circuit. The pulse signal $f_0$ is supplied to the waveform generating circuit through the AND gate A00 when a bit signal $D_0$ of the digital input signal $D_{IN}$ is supplied to the AND gate A00. Similarly, the other pulse signals $f_1, ..., f_n$ are supplied to the waveform generating circuit through the AND gates A01, A11, ..., A0$_n$ and A1$_n$ when the bit signals $D_1, \overline{D}_1, ..., D_n$ and $\overline{D}_n$ are supplied to these AND gates. The waveform generating circuit generates switching signals $C_T$ and $\overline{C}_T$ which have a duty cycle corresponding to the digital input signal $D_{IN}$. If the digital input signal $D_{IN}$ is "100 ... 010", the outputs from the AND gates A1$_n$ and A11 have a high level when frequency $f_n$ and $f_1$ respectively are high. For this $D_{IN}$, the OR gate OG supplies a switching signal $C_T$ such as that shown in FIG. 15. Hence, as far as the circuit of FIG. 14 is concerned, the following equation results:

$$C_T = D_n \cdot f_n + (D_n + \overline{D_n} \cdot f_n)[D_{n-1} \cdot f_{n-1} + (D_{n-1} + \overline{D}_{n-1} \cdot f_{n-1}) \cdot \{\ldots + (D_1 + D_1 \cdot f_1)D_0 \cdot f_0\}]$$

Figure 16:
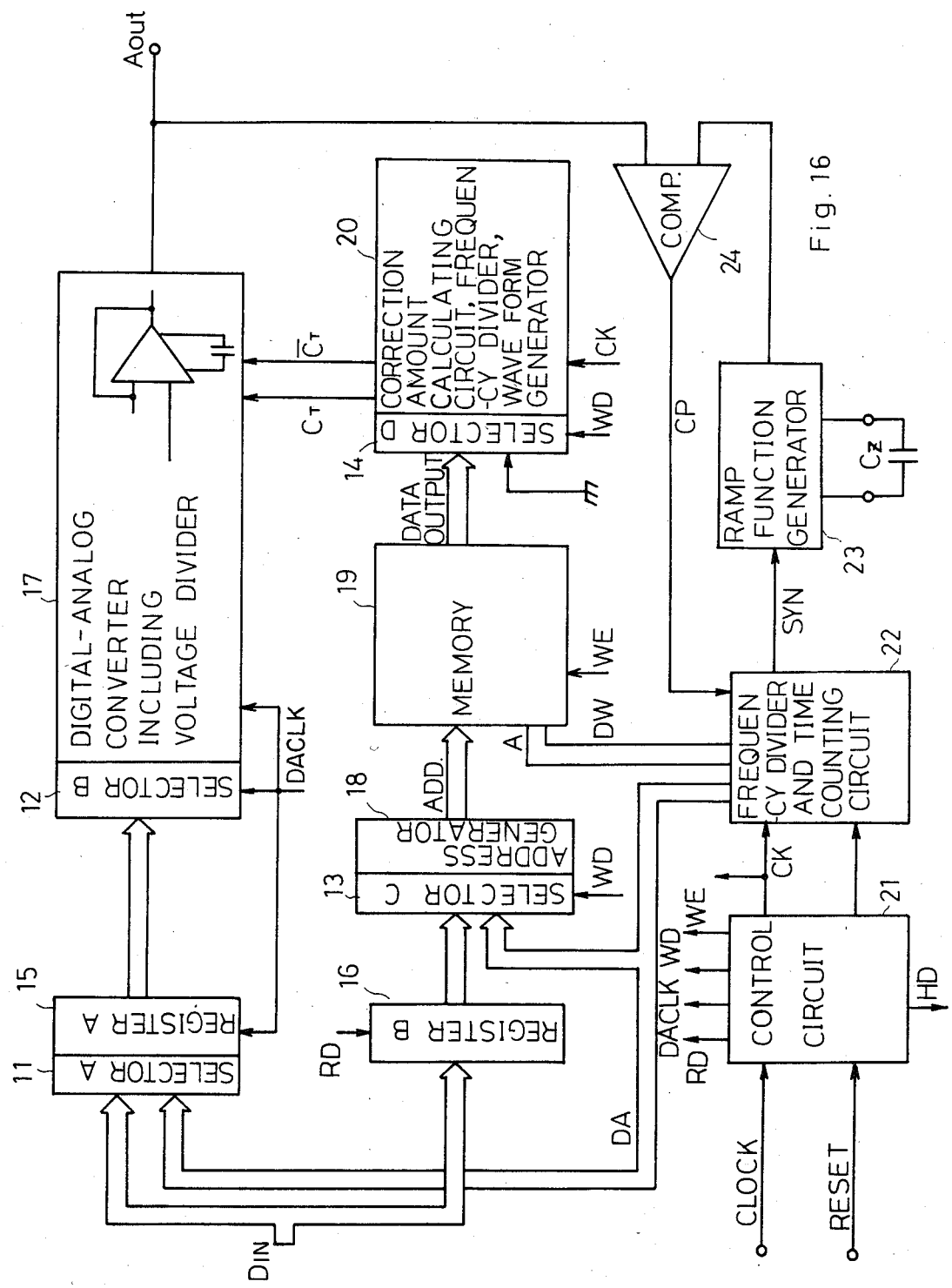
FIG. 16 is a block diagram of a self-correcting digital-analog converter to which the present invention is applied.

FIG. 16 is a block diagram of a self correcting digital-analog converter 17 which uses a voltage dividing circuit according to the present invention. During the self-correction period of the converter 17, an output of the digital-analog converter 17 which has been obtained from digital input data, is compared with an output signal from a ramp function generating circuit 23. The difference DW between these compared outputs is stored in a memory 19 in the form of digital data. During the output mode period of the self-correction digital-analog converter 17, a switching signal is generated according to the contents of the memory 19 and is corrected by the bits of a digital input signal. The switching signal ($C_T$, $\overline{C_T}$) thus generated is used to correct the output from the digital-analog converter 17.

The system shown in FIG. 16 comprises selectors A, B, C and D, respectively 11, 12, 13, 14; registers A15 and B16 for temporarily storing data; an address generating circuit 18; a memory 19; a correction amount calculating circuit, frequency divider, waveform generator or correction circuit 20, a control circuit 21, a frequency dividing/time counting circuit 22, a ramp function generating circuit 23 and a comparator 24.

During the output mode period, digital input data $D_{IN}$ is written into the registers A15 and B16. Data $D_{IN}$ is supplied to the address generating circuit 18 through the selector C13 when a read in signal RD is supplied to the register B16 and a selection signal WD is supplied to the selector C13. Upon receipt of the input data $D_{IN}$ the address generating circuit 18 generates one or more absolute address signals designating the addresses of the memory 19 in which correction data corresponding to the individual bits of the data $D_{IN}$ are stored. The correction data are thus read out from the addresses designated by the absolute address signals and are supplied to the correction circuit 20 through the selector D. The correction circuit 20 generates digital data according to the correction data from the memory 19. At the same time, the correction circuit 20 divides the frequency of a clock signal CK, thus generating pulse signals of various frequencies. The pulse signals are synthesized in accordance with the digital data, thereby generating switching signals $C_T$ and $\overline{C_T}$. When the control circuit 21 generates a signal DACLK which is a little delayed with respect to the readin signal RD, the input data $D_{IN}$ is supplied to the selector B through the register A. The selector B generates digital pattern data which is used to determine the initial charges of the individual capacitors of the voltage dividing circuit at the time of both charging and discharging the capacitors. The digital pattern data is supplied to the digital-analog converter 17 and determines the initial charges of the capacitors.

Now it will be described how the system of FIG. 16 operates during the self-correction period of the digital-analog converter 17. The digital-analog converter 17 is set to self-correction mode by a correction mode signal supplied from the frequency dividing/time counting circuit 22 or a reset signal supplied from an external circuit. Once the converter 17 has been set to the self-correction mode, an HD signal, i.e. self-correction period flag, is set ON. This indicates to the external circuits that the converter 17 is set to the self-correction mode. While the converter 17 is set to the self-correction mode, an output DA from the frequency dividing/time counting circuit 22, not the digital input data $D_{IN}$, is selected by the respective selectors and the data is read uncorrected from the memory 19. All the other control steps are performed in the same way as when the digital-analog converter 17 is set to the output mode, and the digital-analog converter 17 generates an output voltage $V_{OUT}$, i.e. an analog output, which corresponds to the digital input data DA. During the self-correction period the ramp function generating circuit 23 operates and generates a ramp signal. The ramp signal is compared by the comparator 24 with the output voltage $V_{OUT}$ supplied from the digital-analog converter 17. The circuit 23 starts generating a ramp signal upon receipt of a synchronizing signal SYN from the frequency dividing/time counting circuit 22. The ramp signal falls and rises with a predetermined time constant. The comparator 24 stops generating an output signal CP when the ramp signal has the same level as that the output voltage $V_{OUT}$ from the digital-analog converter 17. That is, the output signal CP from the comparator 24 rises to a high level when the ramp function generating circuit 23 generates a ramp signal. It falls to a low level when the level of the ramp signal becomes equal to that of the output voltage $V_{OUT}$. The time during which the signal CP stays at the high level, a correction value, or data DW, is written into the memory 19.

After the data DW is written into the memory 19, another bit pattern data DA is generated from the frequency dividing/time counting circuit 22, whereby another correction value DW is obtained and then written into the memory 19. When all necessary bit pattern data DA are generated and all necessary correction values DW are written into the memory 19, the control circuit 21 stops generating the signal HD. As a result, the self-correction period comes to an end, and the digital-analog converter 17 is set to the output mode.

During the self-correction period it is possible to prevent the output voltage $V_{OUT}$ from passing to outside of the semiconductor chip on which the whole system is formed, by using a gate circuit (not shown) which is controlled by the signal HD. Further, if the time constant of the ramp signal is increased, such that the counter operates at the resolution of the digital-analog converter 17 before the ramp signal linearly changes by about the potential of the least significant bit, so that it generates a coincidence data, the data thus generated can be used as a correction value.

Figure 1:
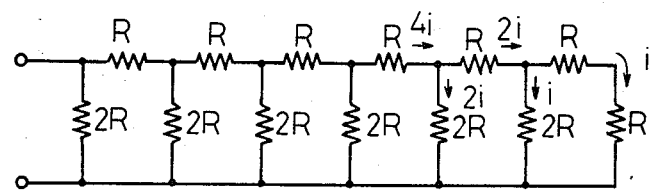
FIGS. 1-4 illustrate a few voltage dividing circuits known hitherto.
Figure 2:
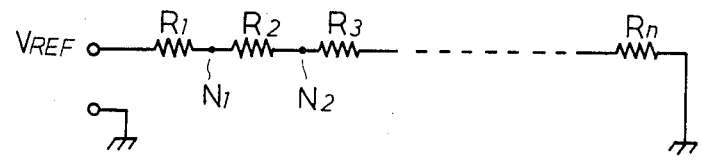
Figure 3:
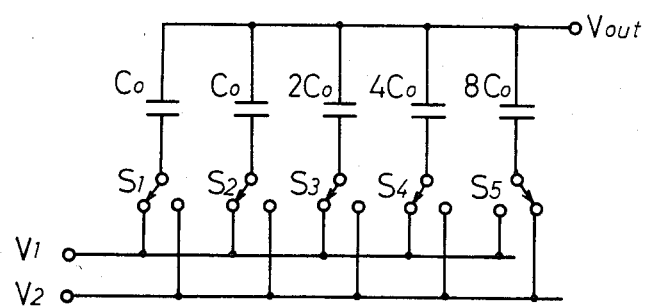

As described above, the high accuracy of the control clock signal is used much to reduce the error in the output voltage, which inevitably results from the difference in the capacitance of each capacitor used and the desired capacitance that the capacitor should have, each capacitor being employed for re-distributing electric charge. A voltage dividing circuit according to the invention is advantageous in that it can generate an output voltage with a higher accuracy than otherwise possible. If it is difficult to apply the embodiment of FIG. 5 to such a capacitor matrix circuit as shown in FIG. 3, the present invention may be applied to a circuit comprised of capacitors of large capacitances.

According to the invention, the voltage division ratio is varied by controlling the pulse width of the control clock signal. Therefore, the accuracy of the output voltage is not affected by the error in, or variation of, the characteristics of the circuit elements used. The resolution with which the digital-analog converter processes a digital input signal can thus be improved.

What is claimed is:

1. A voltage dividing circuit, comprising:
   first power source means for providing a first voltage;
   second power source means for providing a second voltage;
   an output terminal;
   a plurality of capacitance elements of substantially the same capacitance each operatively and continuously connected to the output terminal; and
   switching means, operatively connected to each of said capacitance elements, individually, and to said first and second power source means, for alternately connecting said capacitance elements to said first power source means and said second power source means using simultaneous connection changes, whereby an output voltage, generated by dividing the first and second voltages into fractions by means of the capacitance elements, is generated at the output terminal as an average of periods during which each of said capacitance elements is connected to one of said first power source means and said second power source means.

2. A voltage dividing circuit according to claim 1, wherein each of said capacitance elements is connected alternately to the first and second power source means for the same period of time, thereby cancelling out a capacitance error of each capacitance element and providing an accurate output voltage.

3. A voltage dividing circuit according to claim 1, wherein each of said capacitance elements is connected alternately to said first and second power source means for different periods of time, thereby dividing the first and second voltages with a ratio of one period to the other period and providing different fractions of voltage.

4. A voltage dividing circuit according to claim 1, wherein said switching means comprises:
   switching signal generating means for generating a switching signl indicating the periods during which each capacitance element is connected; and
   connecting means, operatively connected to said switching signal generating means and each of said capacitance elements, for connecting said capacitance elements to said first and second power source means in dependence upon the switching signal.

5. A voltage dividing circuit, comprising:
   first and second power source means for providing reference voltages;
   an output terminal;
   a plurality of resistor elements operatively connected to form a series circuit, forming junction points between connected resistor elements and which series circuit is connected at one end to said first power source means and at the other end to said second power source means;
   switch control means for supplying a switch control signal; and
   a changeover switch circuit, operatively connected to the output terminal and different junction points of the series circuit, for selectively supplying fractions of voltage defined by said resistor elements, the fractions of voltage being supplied for periods of time defined by the switch control signal, whereby an output voltage is generated as a function of the average of the periods of time during which said changeover switch circuit supplies the fractions of voltage.

6. A voltage dividing device, comprising:
   first and second power source means for supplying voltages;
   capacitors having respective first electrodes, commonly connected second electrodes and capacitance values which are substantially equal; and
   control means operatively connected to said first and second power source means and the first electrodes of said capacitors, for connecting the first electrodes of said capacitors repeatedly to one and then the other of said first and second power source means for periods of time, thereby providing an output at the commonly connected second electrodes of said capacitors which has a value that is determined by the capacitance values and the periods of time that said capacitors are connected to said first and second power source means.

7. A voltage dividing device as set forth in claim 6, wherein said capacitors are connected in parallel, and wherein said control means alternately connects all the capacitors to said first power source means then to said second power source means.

8. A voltage dividing device as set forth in claim 6, wherein said capacitors are divided into first and second groups, and
   wherein said control means connects the first group to said first power source means and said second group to the second power source means for a first connection time, and then connects said first group to the second power source means and the second group to said first power source means for a second connection time.

9. A voltage dividing device, comprising:
   first power supply means for supplying a first voltage;
   second power supply means for supplying a second voltage lower than the first voltage;
   resistors connected in a series network forming connection points therebetween, said series network operatively connected to said first and second power supply means; and
   control means, operatively connected to said first and second power supply means and said series network, for generating an output voltage greater than or equal to the second voltage and less than or equal to the first voltage by supplying one of the first voltage, the second voltage and a third voltage generated by repeatedly switching between at least two of the connection points in said series network.

10. A voltage dividing device as set forth in claim 9, wherein said control means comprises:
    input terminals each connected to a different connection point;
    an output terminal; and
    switching means, operatively connected to said input terminals and said output terminal, for connecting the output terminal to different input terminals for an amount of time and providing the output voltage at the output terminal, the output voltage having a level which is determined by the amount of time each input terminal is connected to the output terminal.

11. A voltage dividing device as set forth in claim 10, wherein the output voltage is determined by which of said input terminals is connected and the amount of time each input terminal is connected.

* * * * *

UNITED STATES PATENT AND TRADEMARK OFFICE
CERTIFICATE OF CORRECTION

PATENT NO. : 4,578,772

DATED : March 25, 1986

INVENTOR(S) : Fujii

It is certified that error appears in the above-identified patent and that said Letters Patent is hereby corrected as shown below:

Front page, [57] ABSTRACT, line 9, after "used" insert --as--.
Column 1, line 30, delete ".";
          line 31, "So" should be --and so--.
Column 4, line 9, "capacitor" should be --capacitors--.
Column 5, line 33, delete "are";
          line 34, after "end" insert --are--;
          line 48, "embodiments" should be --embodiment--;
          line 52, delete "is".
Column 6, line 58, "$C_0 \Delta$" should be --$C_0 + \Delta$--;

line 61, "2 V" should be --$2 \Delta V$--.
Column 8, line 62, "in" should be --is--.
Column 9, line 19, "voltage" should be --voltages--;
          line 50, "signals" should be --signal--;

line 60, "$2^{10}$" should be --$2^{10} \cdot T_0$--.

Column 10, [line numbering off] line 48, delete "consituting".
Column 11, line 17, [line numbering off], "each capacitance" should be --each capacitor--;
          line 35, "with" should be --width--.

UNITED STATES PATENT AND TRADEMARK OFFICE
CERTIFICATE OF CORRECTION

PATENT NO. : 4,578,772
DATED : March 25, 1986
INVENTOR(S) : Fujii

It is certified that error appears in the above-identified patent and that said Letters Patent is hereby corrected as shown below:

```
Column 12, line 15, delete "is".
Column 14, line 18, delete "that".
```

Signed and Sealed this

Fifth Day of August 1986

[SEAL]

Attest:

Attesting Officer

DONALD J. QUIGG

Commissioner of Patents and Trademarks